United States Patent
Sato

(10) Patent No.: US 9,555,555 B2
(45) Date of Patent: Jan. 31, 2017

(54) APPARATUS FOR CUTTING VITREOUS SILICA CRUCIBLE

(75) Inventor: Masaru Sato, Akita (JP)

(73) Assignee: SUMCO CORPORATION, Tokyo (JP)

( * ) Notice: Subject to any disclaimer, the term of this patent is extended or adjusted under 35 U.S.C. 154(b) by 1164 days.

(21) Appl. No.: 12/933,043

(22) PCT Filed: Mar. 16, 2009

(86) PCT No.: PCT/JP2009/054996
§ 371 (c)(1),
(2), (4) Date: Sep. 16, 2010

(87) PCT Pub. No.: WO2009/116476
PCT Pub. Date: Sep. 24, 2009

(65) Prior Publication Data
US 2011/0011228 A1    Jan. 20, 2011

(30) Foreign Application Priority Data

Mar. 19, 2008    (JP) .................................. 2008-072588

(51) Int. Cl.
*B26D 7/02*    (2006.01)
*B28D 1/24*    (2006.01)
(Continued)

(52) U.S. Cl.
CPC . *B28D 1/24* (2013.01); *B26D 7/02* (2013.01); *B28D 7/04* (2013.01); *C03B 33/06* (2013.01);
(Continued)

(58) Field of Classification Search
CPC .............. B28D 1/24; B28D 7/04; C03B 33/06; C03B 33/10; C03B 33/105; C03B 33/107; C30B 15/10; C30B 35/002; Y10T 83/0596; Y10T 83/222; Y10T 83/6547; Y10T 83/6548; Y10T 83/655; Y10T 83/6552; Y10T 83/6555; Y10T 82/16016; Y10T 82/16967; Y10T 82/2511; Y10S 83/924; Y10S 83/946; B26D 7/02; B26D 7/06
(Continued)

(56) References Cited

U.S. PATENT DOCUMENTS 5,964,024 A *   10/1999   Wallace ......................... 29/558
6,282,766 B1 *  9/2001    Wallace ........................ 29/27 C
6,405,623 B2 *  6/2002    Lavallee ........................... 83/13

FOREIGN PATENT DOCUMENTS

JP    02-111633 A    4/1990
JP    09-208370 A    8/1997
(Continued)

OTHER PUBLICATIONS

International Search Report for PCT/JP2009/054996; mailing date Jun. 16, 2009.

*Primary Examiner* — Clark F Dexter
(74) *Attorney, Agent, or Firm* — Greenblum & Bernstein, P.L.C.

(57)    ABSTRACT

A cutting method and an apparatus are provided which enable a rim area or other part of a vitreous silica crucible to be cut off so as to leave a smooth cut surface without damaging the cut edge, etc. The apparatus for cutting the crucible comprises a disk-shaped cutting blade (10) disposed to be movable with respect to the crucible. Without rotating the crucible (20), the rotating cutting blade (10) is brought into contact with a surface of the crucible wall and pushed forward in the wall thickness direction to make a cut piercing the crucible wall. The cutting blade (10) is moved relatively to the crucible (20) in the circumferential direction of the crucible (20) while keeping the cutting blade in the state of piercing the wall. A rim area (25) of the crucible (20) is thus cut off.

1 Claim, 4 Drawing Sheets

(51) Int. Cl.
  *B28D 7/04*   (2006.01)
  *C03B 33/06*  (2006.01)
  *C30B 15/10*  (2006.01)
  *C30B 35/00*  (2006.01)

(52) U.S. Cl.
  CPC ............ *C30B 15/10* (2013.01); *C30B 35/002* (2013.01); *Y10S 83/946* (2013.01); *Y10T 82/16967* (2015.01); *Y10T 83/0596* (2015.04); *Y10T 83/222* (2015.04); *Y10T 83/6552* (2015.04)

(58) Field of Classification Search
  USPC .......... 83/924, 54, 167, 410.7, 410.8, 410.9, 83/411.1, 411.3, 946; 82/47, 101, 122
  See application file for complete search history.

(56) References Cited

FOREIGN PATENT DOCUMENTS

| | | |
|---|---|---|
| JP | 2001-226134 A | 8/2001 |
| JP | 2001-348239 A | 12/2001 |
| JP | 2004-323338 A | 11/2004 |

\* cited by examiner

APPARATUS FOR CUTTING VITREOUS SILICA CRUCIBLE

TECHNICAL FIELD

The present invention relates to a method and apparatus for smoothly cutting a rim area (open circumferential portion) of a vitreous silica crucible. More particularly, the present invention relates to a method and apparatus for cutting a vitreous silica crucible, for example, a vitreous silica crucible used for pulling silicon single crystal, capable of smoothly cutting a rim area or other portion without damaging the cut edge, etc.

BACKGROUND ART

A vitreous silica crucible, into which silicon melt is put, is used for pulling silicon single crystal. This vitreous silica crucible is manufactured according to rotational molding by uniformly depositing quartz powder on an inner surface of a rotating mold, and heating and melting the quartz powder for vitrification thereof. In this manufacturing method, it is difficult for the crucible to have a uniform open circumferential portion (rim area) and, therefore, products manufactured by this method need to be finished by cutting the non-uniform rim area. In a related art method, the rim area was manually cut off. However, such a manual cutting of the rim area becomes a burden as the crucible size gets larger, and therefore there has been an attempt to mechanize the cutting process of the crucible for reducing the burden.

As an apparatus for cutting a vitreous silica crucible, a rim cutting apparatus including a supporting means of the crucible and a cutting means of a rim has been known. The supporting means includes an arm which can be opened or closed for gripping the crucible and an operating means thereof for rotational and up-down movement, and the cutting means includes a cutting blade and a moving means thereof. Preferably, the cutting apparatus further includes a mechanism of centering the crucible and a mechanism of taking out the cut rim, and performs a series of operations of centering the crucible, cutting the rim, and taking out the cut rim successively (refer to Japanese Patent Application Laid-Open No. 2001-226134.

The rim cutting apparatus can mechanically cut off a rim of a vitreous silica crucible with high precision, and complete the rim-cutting operation of a large-sized vitreous silica crucible in a short time. Furthermore, since it is possible to automate a series of operations from the centering of the crucible to the taking out of the cut rim, the rim cutting apparatus is considered to be useful for significantly increasing working efficiency.

Meanwhile, when cutting a rim area of a vitreous silica crucible, as illustrated in FIG. 6, a wall is cut by bringing a cutting blade 10 into contact with an outer surface 21 of a sidewall of a crucible 20 and moving the cutting blade 10 toward the inside of the crucible 20, while rotating the crucible 20.

According to the cutting method above, a cutting groove 28 extending around the entire circumference of the crucible is formed in an outer surface 21 of the crucible 20, and the cutting groove 28 progresses in the wall's thickness direction so that a cutting end portion is positioned at an inner surface 22 of the crucible. This way, the load of the cut rim area 25 concentrates on a thin cut section of the inner surface 22 of the crucible 20, so that a crack may be easily generated and a cut edge of the inner surface can be damaged. Thus, burrs 23 and defects 24 may possibly be remain on the inner surface of the crucible after cutting, as illustrated in FIG. 7. In the case where the crucible is cut by bringing the cutting blade 10 into contact with the inner surface of the crucible and moving the cutting blade 10 toward the outer surface, the result is also the same as above.

[Patent Document 1] Japanese Patent Application Laid-Open No. 2001-226134

DISCLOSURE OF THE INVENTION

Problems to be Solved by the Inventions

The present invention provides a method and apparatus for cutting a vitreous silica crucible, capable of smoothly cutting a rim area or other portion without damaging the cut edge, etc.

Means for Solving the Problems

The present invention relates to a method and apparatus for cutting a vitreous silica crucible which solve the above-mentioned problems according to the configurations below.

[1] A method for cutting a vitreous silica crucible, including: forming a cut penetrating a wall of a crucible by a cutting blade; and cutting a rim area of the crucible by relatively moving the cutting blade with respect to the crucible in a circumferential direction of the crucible while the cutting blade keeps penetrating the wall to allow the cut penetrating the wall to extend around an entire circumference of the crucible.

[2] A method for cutting a vitreous silica crucible of the above [1], wherein the cut penetrating the wall is formed by bringing the cutting blade into a surface of the crucible wall and pushing forward the cutting blade in the wall's thickness direction, without rotating the crucible; and the rim area of the crucible is cut off by relatively moving the cutting blade with respect to the crucible in the circumferential direction of the crucible through rotation of the crucible or moving the cutting blade in the circumferential direction of the crucible through a cutting-blade moving means while the cutting blade keeps penetrating the wall.

[3] A method for cutting a vitreous silica crucible, wherein a groove extending around an entire circumference of the crucible is formed on either of an outer surface or inner surface of the crucible; and the rim area is cut off by the method of the above [1] or [2] from a surface opposite to a surface where the groove is formed.

[4] A method for cutting a vitreous silica crucible, wherein a groove extending around an entire circumference of the crucible is formed on either of an outer surface or inner surface of the crucible; and the rim area is cut off by moving the cutting blade toward the groove from a surface opposite to a surface where the groove is formed.

[5] An apparatus for cutting a vitreous silica crucible, including a disk-shaped cutting blade disposed sideways with respect to the vitreous silica crucible, a means for rotating the cutting blade, a cutting-blade moving means which moves the cutting blade in a circumferential direction of the crucible, and a means for rotating the crucible, wherein the cutting blade which is rotating is brought into contact with a surface of the crucible wall and pushed forward in the wall's thickness direction to make a cut penetrating the crucible wall, and a rim area of the crucible is cut off by relatively moving the cutting blade with respect to the crucible in the circumferential direction of the crucible while the cutting blade keeps penetrating the wall.

[6] An apparatus for cutting a vitreous silica crucible of the above [5], further comprising a support where the crucible is disposed facing upward, and an elevatable supporting means disposed over the crucible, wherein the cut rim area is maintained in such a way that the cut rim area is hung by the supporting means.

[7] An apparatus for cutting a vitreous silica crucible of the above [5], further comprising a support where the crucible is disposed facing downward, an elevatable supporting means disposed over the crucible, and an arm extending upward from the support, wherein the crucible is maintained facing downward by the supporting means, the rim area is cut off while the rim area is maintained by the arm, the crucible of which rim area is cut off is taken out while the crucible is maintained facing downward, and then the cut rim area is taken out.

Effect of the Invention

According to the cutting method of the present invention, a cut penetrating a wall of a crucible is formed by a cutting blade, and the cut extends around the entire circumference of the crucible by relatively moving the cutting blade with respect to the crucible in a circumferential direction of the crucible while the cutting blade keeps penetrating the wall. This way, the cut extends in the circumferential direction of the crucible in the state where the total thickness of the wall is being cut off. Therefore, the load of the cut rim area does not concentrate on the inner surface immediately before being cut off, so that the formation of burrs or defects on the cut edge can be substantially reduced.

Specifically, according to the cutting method of the present invention, the cut penetrating the wall of the crucible is formed by bringing the cutting blade, which is rotating, into contact with the surface of the crucible wall and pushing forward the cutting blade in the wall's thickness direction without rotating the crucible, and the cutting blade maintains the state of penetrating the wall. This way, the cutting of the crucible can be easily performed without use of a special cutting means just by relatively moving the cutting blade in the circumferential direction of the crucible as the crucible rotates, or only moving the cutting blade in the circumferential direction of the crucible through the cutting-blade moving means.

Furthermore, the cutting method of the present invention includes cutting a rim area of the crucible by forming a groove extending around the entire circumference of the crucible on either of the outer surface or inner surface of the crucible, and moving the cutting blade toward the groove from the surface opposite to the surface where the groove is formed. According to this cutting method, the cutting blade is moved toward the groove from the surface opposite to the surface where the groove is formed, so that the cutting end portion is positioned inside the groove. Accordingly, burrs or defects are not formed on the surface of the crucible.

According to the method for cutting the wall of the crucible including: forming a groove extending around the entire circumference of the crucible on either of the outer surface or inner surface of the crucible; forming a cut penetrating the wall from the surface opposite to the surface where the groove is formed; and extending the cut around the entire circumference, burrs or defects are not formed on the surface of the crucible and thus the rim area can be smoothly cut off even when the cut penetrating the wall is formed or extended around the entire circumference of the crucible.

The cutting apparatus of the present invention includes: a disk-shaped cutting blade installed sideways with respect to the crucible; a means for rotating the cutting blade; a cutting-blade moving means allowing the cutting blade to move in the circumferential direction of the crucible; and a means for rotating the crucible. A cut penetrating the wall of the crucible is formed by bringing the cutting blade which is rotating into contact with the wall of the crucible and pushing forward the cutting blade in the wall's thickness direction without rotating the crucible. The rotating blade and the support are controlled such that the crucible is rotated to let the cutting blade relatively move with respect to the crucible in the circumferential direction while the cutting blade keeps penetrating the wall. Consequently, it is possible to smoothly cut off the rim area without the formation of burrs or defects on the cut edge.

Furthermore, because the cutting apparatus includes the elevatable supporting means that is installed over the crucible, the installation and take-out of the crucible can be mechanically performed by the supporting means. Also, since the rim area can be supported during the cutting of the crucible, it is possible to prevent the rim area from colliding against the cut section at the completion of the cutting and the cut rim area can be taken out mechanically.

EXPLANATION OF REFERENCE SYMBOL

10—cutting blade, 11—supporting means, 12—support, 13—supporting means, 14—arm, 15—cushioning member, 16—rotational axis, 17—arm, 18—cushioning member, 20—crucible, 21—outer surface, 22—inner surface, 23—burr, 24—defect, 25—rim area, 27—groove, 28—cutting groove, 30—cut Best Embodiment for Carrying Out the Invention Hereinafter, the present invention will be described in detail based on exemplary embodiments.

Figure 1:
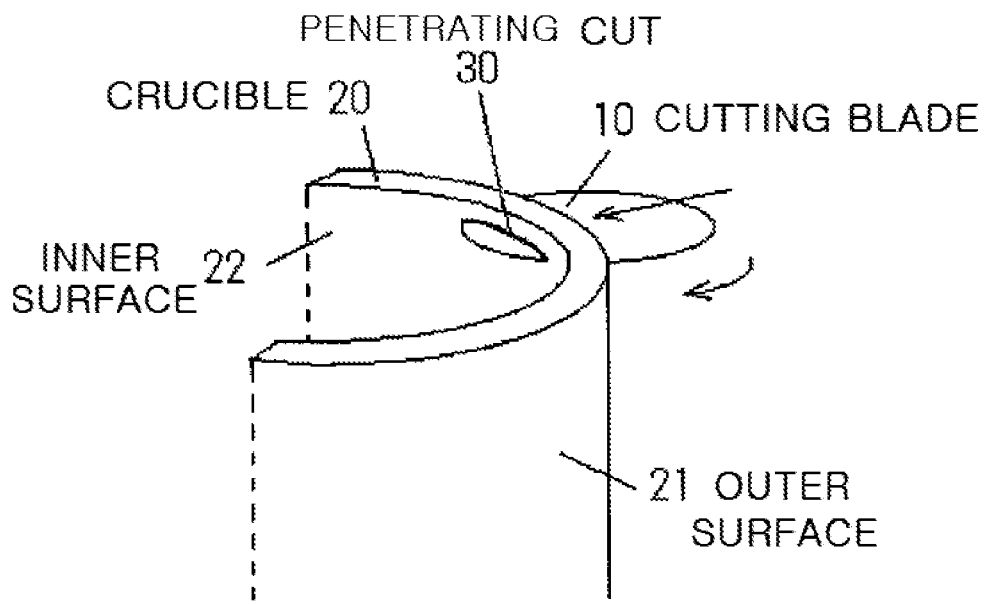
FIG. 1 is an explanatory view illustrating a cutting method in accordance with an exemplary embodiment.
Figure 2:
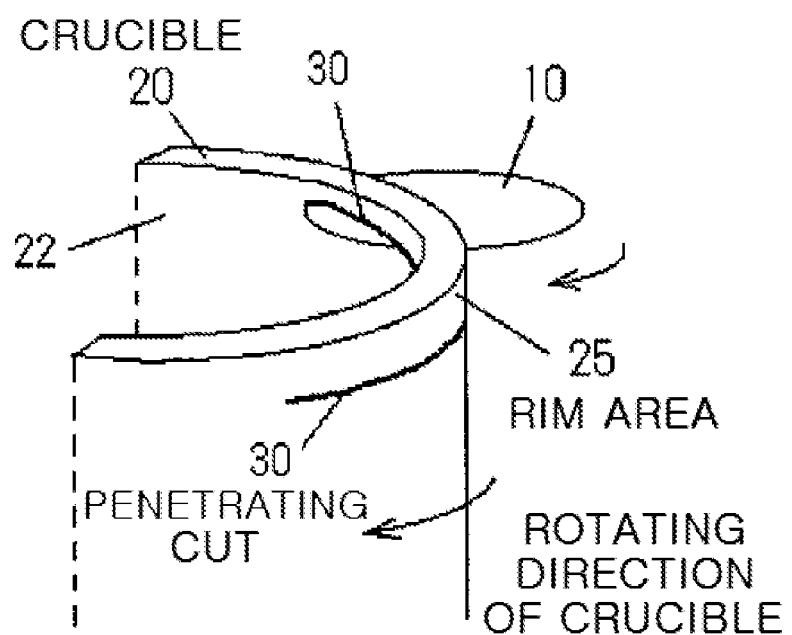
FIG. 2 is an explanatory view illustrating a cutting method in accordance with the present invention.
Figure 3:
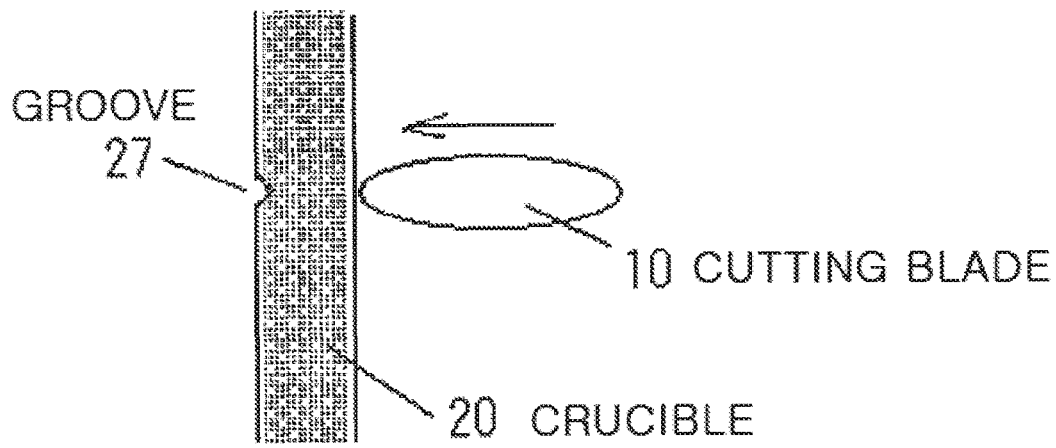
FIG. 3 is an explanatory view illustrating a cutting method in accordance with the present invention.

FIGS. 1 through 3 are explanatory views schematically illustrating a method for cutting a vitreous silica crucible in accordance with the present invention.

In the cutting method of the exemplary embodiment, as illustrated in FIG. 1, a cut 30 penetrating a wall of a crucible 20 is formed by bringing a cutting blade 10, which is rotating, into contact with a surface (outer surface 21 in an example of FIG. 1) of the crucible wall, and by pushing forward the cutting blade 10 in the wall's thickness direction (toward an inside of the crucible) while the crucible 20 is not rotating. Therefore, as illustrated in FIG. 1, the cutting blade 10 penetrates the wall of the crucible 20, and appears at the inner surface of the crucible 20.

Thereafter, as illustrated in FIG. 2, the cutting blade 10 relatively moves with respect to the crucible 20 in the circumferential direction of the crucible 20 by rotating the crucible 20, while the cutting blade 10 keeps penetrating the wall of the crucible 20. As the crucible makes one rotation such that the cut part (cut) 30 extends in the circumferential direction of the crucible 20 with the total thickness of the wall part being penetrated by the cutting blade, a rim area 25 is at last cut off when the cut part (cut) 30 extends around the entire circumference of the crucible 20.

According to the cutting method above, since the cut part extends in the circumferential direction of the crucible 20 in the state where the total thickness of the wall part is cut off, the load of the cut rim area 25 does not concentrate on the inner surface immediately before cut off. Accordingly, the formation of burrs or defects at a cut edge can be substantially reduced. Also, in the cutting method of the exemplary embodiment, the cut 30 penetrating the wall may be formed by bringing the cutting blade 10 into contact with the inner surface of the crucible 20 and by moving the cutting blade 10 toward the outer surface.

According to another cutting method of the present invention, as illustrated in FIG. 3, a shallow groove 27 extending around the entire circumference of the crucible 20 is formed on either of the outer surface or inner surface of the crucible 20, and the rim area of the crucible is cut off by moving the cutting blade 10 toward the groove 27 from the surface opposite to the surface where the groove 27 is formed. The depth of the groove 27 may be in the range of about 1 mm to about 3 mm. The width of the groove 27 may be 0.5 to 2 times the width of the cutting blade 10, and preferably 1 to 2 times the width of the cutting blade 10. The cutting blade 10 used to form the cut 30 penetrating the wall may be used for forming the groove 27, and in this case, the width of the groove 27 is approximately equal to the width of the cut 30. According to this cutting method, a cutting end portion is positioned inside the groove 27 because the cutting blade 10 is moved toward the groove 27 from the surface opposite to the surface where the groove 27 is formed. Therefore, burrs and defects are not formed on the crucible surface.

Figure 4:
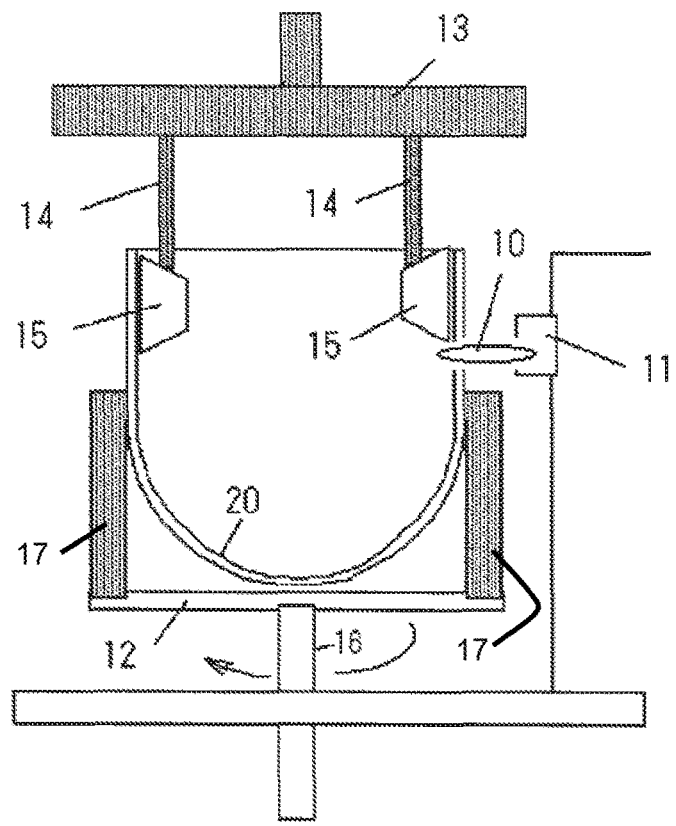
FIG. 4 is a schematic view illustrating a cutting apparatus in accordance with the present invention.

FIG. 4 schematically illustrates a cutting apparatus in accordance with the present invention. The cutting apparatus shown in FIG. 4 includes a disk-shaped cutting blade 10 disposed sideways with respect to a crucible 20, and a supporting means 11 of the cutting blade 10. A cutting-blade moving means (not shown) for moving the cutting blade 10 in a circumferential direction of the crucible 20 is installed at the supporting means 11.

The cutting apparatus further includes a rotatable support 12 where the crucible 20 is installed, the support 12, on which a pair of arms 17 are installed, is coupled to a rotating means (not shown) with a rotational axis 16 interposed therebetween. At a side of the support 12, the supporting means 11 is installed. In an example illustrated in FIG. 4, the crucible 20 is installed on the support 12 such that an opening of the crucible 20 faces upward.

Over the crucible 20, an elevatable supporting means 13 is installed. The supporting means 13 includes a pair of arms 14 extending downward, and the pair of arms 14 are formed such that they can be opened and closed left and right when viewed in FIG. 4. At a lower end of the arm 14, a cushioning member 15 is installed.

The installation and take-out of the crucible is mechanically performed by the supporting means 13. The arms 14 of the supporting means 13 support the crucible 20 by moving the arms 14 above the crucible 20 installed facing upward, allowing the arms 14 to descend toward the inside of the opening of the crucible, and opening both of the arms 14 to press the cushioning member 15 onto the inner surface of the crucible. In this state, the supporting means 13 moves to an upper region of the support 12 and the arms 14 then descend, so that the crucible 20 is installed on the support 12.

In the cutting apparatus of FIG. 4, after cutting the rim area of the crucible 20 is installed facing upward, the supporting means 13 ascends while keeping the state of supporting the rim area 25, then moves sideways, and thereafter the rim area 25 is taken out to the outside. Afterwards, the supporting means 13 returns to a position above of the crucible 20, and then the arms 14 descend toward the inside of the crucible 20. After that, the supporting means 13 supports the crucible 20 by opening the arms 14 left and right, bringing the cushioning members 15 into contact with the inside of the crucible 20, and by pushing forward the cushioning members 15. In this state, the supporting means 13 ascends, then moves sideways, and the crucible 20 is taken out to the outside.

Figure 5:
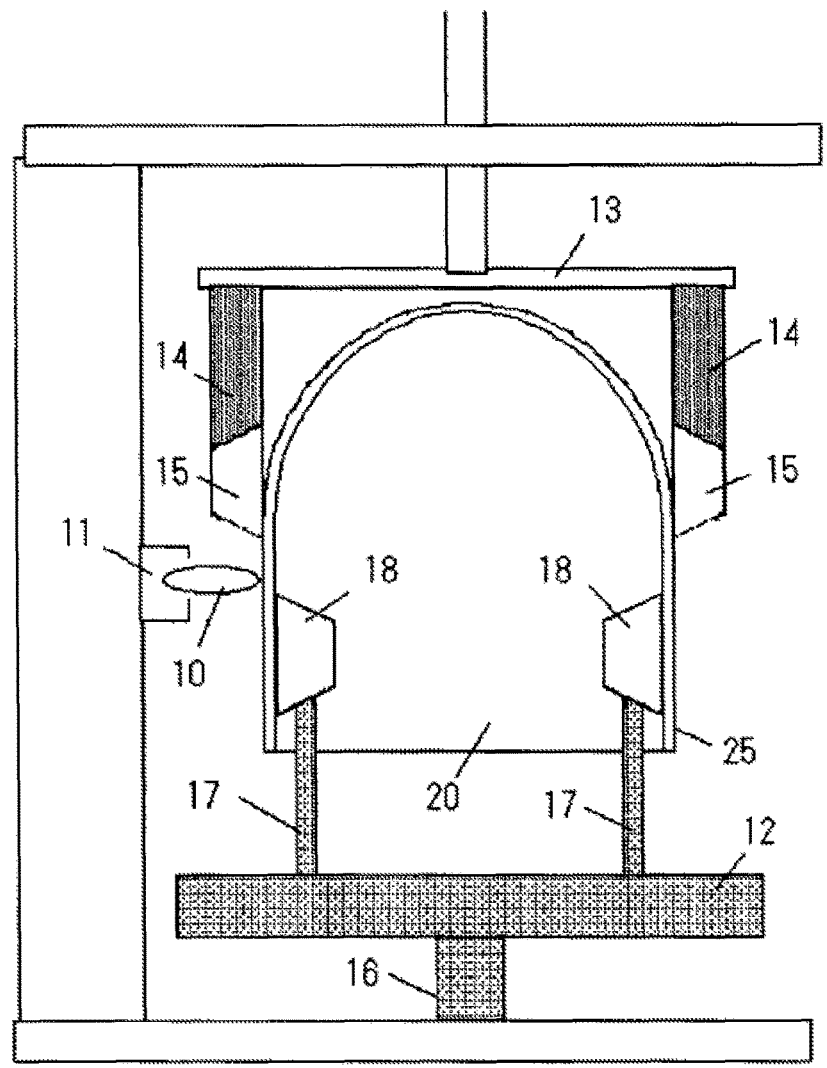
FIG. 5 is a schematic view illustrating a cutting apparatus in accordance with another exemplary embodiment.
Figure 6:
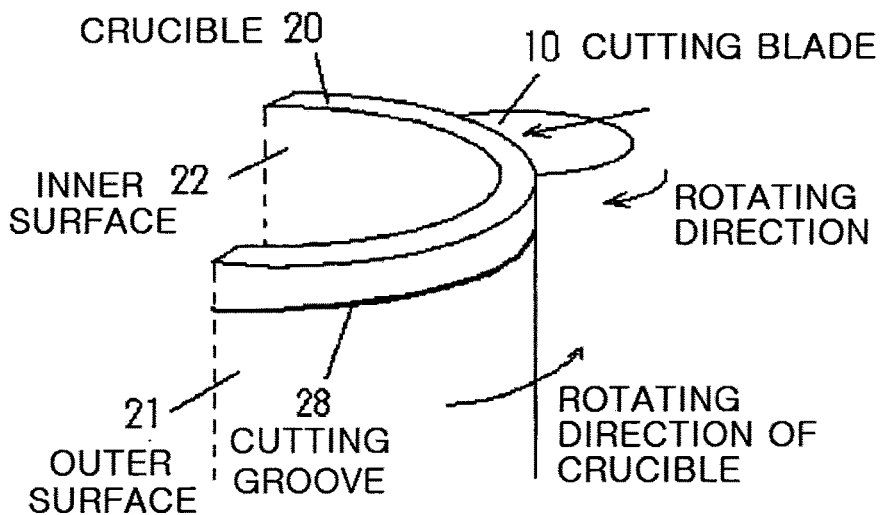
FIG. 6 is an explanatory view illustrating a related art cutting method.
Figure 7:
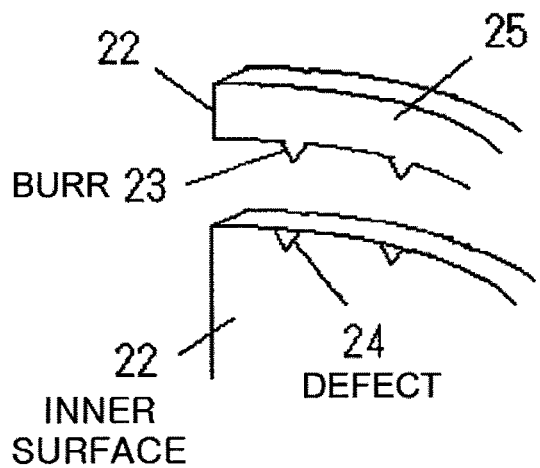
FIG. 7 is an explanatory view illustrating a related art cutting method.

FIG. 5 illustrates an apparatus for cutting the rim area of the crucible 20 installed facing downward. In the cutting apparatus of FIG. 5, a rotatable support 12 where the crucible 20 is installed is provided. The support 12 is coupled to a rotating means (not shown) with a rotational axis 16 interposed therebetween. On the surface of the support 12, a pair of arms 17 extending toward the inside of the crucible 20 are installed, and a cushioning member 18 is installed at an upper end of each arm 17. The arms 17 are formed such that they can be opened and closed left and right when viewed in FIG. 5. The arms 17 are inserted into the inside of the crucible 20 and opened left and right to press the cushioning members 18 onto the rim area 25, thereby supporting the rim area 25 from the inside thereof.

Over the crucible 20, an elevatable supporting means 13 is installed. The supporting means 13 includes a pair of arms 14 extending toward a lower region from an outer side of the crucible, and the pair of arms 14 are formed such that they can be opened and closed left and right when viewed in FIG. 5. At a lower end of each arm 14, a cushioning member 15 is installed.

At a side of the supporting means 13, a disk-shaped rotating blade 10 is installed. The rotating blade 10 is disposed sideways with respect to the crucible 20, and rotatably supported by a supporting means 11. A means (not shown) for moving the cutting blade 10 back and forth with respect to the crucible 20 is installed at the supporting means 11.

In accordance with the cutting apparatus of FIG. 5, during the cutting of the rim area, the crucible 20 is supported by the supporting means 13 in the state that the crucible faces downward, and the rim area 25 is supported by the arm 17. After cutting the rim area 25, the supporting means 13 ascends while keeping the state of supporting the crucible 20, then moves sideways, and thereafter the crucible 20 is taken out to the outside. While the crucible 20 is being taken out, the cut rim area 25 is supported by the arm 17. Thereafter, the supporting means 13 returns to the upper region of the rim area 25, and then the arm 14 descends to support the rim area 25 by opening the arms 14 left and right, bringing the cushioning members 15 into contact with the inside of the rim area 25, and pushing forward the cushioning members 15. In this state, the supporting means 13 ascends, then moves sideways, and the cut rim area 25 is taken out to the outside.

In both of the cutting apparatuses of FIGS. 4 and 5, the cut penetrating the wall is formed first without rotating the crucible 20, and the cutting blade is then relatively moved with respect to the crucible 20 in the circumferential direction by rotating the crucible 20 while the cutting blade keeps penetrating the wall. Thus, the rim area 25 is cut off.

In specific, the cut penetrating the wall of the crucible 20 is formed by bringing the cutting blade 10 which is rotating into contact with the surface (outer surface) of the crucible wall, and moving the cutting blade in the wall's thickness direction. Thereafter, the operations of the rotating blade 10 and the support 12 are controlled such that the crucible is rotated to relatively move the cutting blade 10 with respect to the crucible 20 in the circumferential direction while the cutting blade keeps penetrating the wall. As the crucible 20 makes one rotation, the cutting blade 10 accordingly moves around the entire circumference of the crucible while the blade keeps penetrating the wall, and resultantly the rim area 25 is cut off.

Since the crucible is installed facing upward in the cutting apparatus of FIG. 4, a supporting means at a lower side is not necessary, the apparatus can be simplified and the cut rim area hung by the supporting means can be taken to the outside as it is. Meanwhile, in the cutting apparatus of FIG. 5 where the crucible 20 is installed facing downward, lubricating water which is supplied during the cutting operation does not remain inside the crucible so that the crucible is not contaminated.

The invention claimed is:

1. An apparatus for cutting a vitreous silica crucible, comprising:
    a disk-shaped cutting blade configured to cut the vitreous silica crucible;
    a first support;
    a pair of inner arms, each inner arm having a proximal end and a distal end defining a vertical length of the respective inner arm, each inner arm attached to the first support at the proximal end and extending in a first vertical direction away from the first support;
    a cushion on the distal end of each inner arm, each cushion having an outwardly facing contact surface, each outwardly facing contact surface having a vertical length that is less than the vertical length of the respective inner arm and each cushion being spaced from the first support by a vertical distance that is greater than the vertical length of the respective outwardly facing contact surface, each outwardly facing contact surface configured to engage an inner side of a wall of the crucible;
    a second support; and
    a pair of outer arms attached to the second support, each outer arm extending from the second support in a second vertical direction that is opposite the first vertical direction, each outer arm configured to engage an outer side of the wall of the crucible;
    wherein the cutting blade is a rotatable cutting blade translatable substantially horizontally toward and away from a center vertical axis of the first support for contacting a surface of the crucible wall and pushing through the crucible wall for making a cut that penetrates the crucible wall, and wherein, upon the translation of the cutting blade through the crucible wall, a rim area of the crucible can be cut off by relatively moving the cutting blade with respect to the crucible in the circumferential direction of the crucible while the cutting blade keeps penetrating the wall; and
    wherein the inner arms are configured to hold the cut off rim area of the crucible.

* * * * *